United States Patent [19]
Poot et al.

[11] 3,989,522
[45] Nov. 2, 1976

[54] MANUFACTURE OF A PLANOGRAPHIC PRINTING PLATE BY MAKING SILVER HALIDE AREAS OF EMULSION OLEOPHICIC

[75] Inventors: Albert Lucien Poot, Kontich; Jan Frans Van Besauw, Mortsel; Frans Clement, Kontich, all of Belgium

[73] Assignee: AGFA-GEVAERT N.V., Mortsel, Belgium

[22] Filed: Feb. 18, 1975

[21] Appl. No.: 550,441

[30] Foreign Application Priority Data
Feb. 26, 1974 United Kingdom............... 8708/74

[52] U.S. Cl.................................. 96/33; 101/455; 101/456; 101/463; 101/466
[51] Int. Cl.².......................................... G03F 7/02
[58] Field of Search................... 96/29 L, 33, 36.3; 101/455, 456, 463, 466, 467

[56] References Cited
UNITED STATES PATENTS

| | | | |
|---|---|---|---|
| 3,161,508 | 12/1964 | Hepher et al. | 96/33 |
| 3,454,398 | 7/1969 | Wendt | 96/33 |
| 3,676,125 | 7/1972 | De Haes | 96/33 |
| 3,679,412 | 7/1972 | Guthrie et al. | 96/33 |
| 3,759,850 | 9/1973 | Lehman | 96/33 |
| 3,808,002 | 4/1974 | Eckert et al. | 96/33 |
| 3,819,374 | 6/1974 | Kemp | 96/29 L |

*Primary Examiner*—Edward G. Kimlin
*Attorney, Agent, or Firm*—William J. Daniel

[57] ABSTRACT

A method for the preparation of a planographic printing plate wherein a photoexposed and developed photographic material containing a pattern of poorly water-soluble silver salt is treated with an aqueous liquid which contains in dissolved state an organic cationic compound or mixture of organic cationic compounds, iodide ions, and a sufficient amount of hydronium ions ($H_3O^+$) for creating an acidic medium, said liquid being capable of making an unexposed and undeveloped photographic silver halide material as defined in the disclosure sufficiently receptive for a lithographic ink.

18 Claims, No Drawings

MANUFACTURE OF A PLANOGRAPHIC PRINTING PLATE BY MAKING SILVER HALIDE AREAS OF EMULSION OLEOPHILIC

The present invention relates to a method for the preparation of a planographic printing plate with a photographic silver halide material and to the use of said plate in a planographic printing process.

Various photographic materials are employed in the lithographic art for the formation of an oleophilic greasy ink-accepting image on an oleophobic greasy ink-repellent surface.

There is a demand for small flexible plates for "small offset," office copy offset printing. The production of these plates has to proceed in a reliable and preferably in an automated way. The presensitized plates essentially consisting of dichromate-sensitized hydrophilic colloids and diazo-sensitized organic colloids do not completely fulfill said requirements and have but a limited shelf-life. They also lack the sensitivity to make a litho plate by optical projection within acceptable exposure times.

Silver halide emulsion materials that have a high inherent photosensitivity and that can be spectrally sensitized have been adapted already for the automated production of lithographic plates.

Special photographic silver halide materials have been developed for the production of a "positive" planographic printing plate, i.e. one in which the unexposed areas corresponding with the image areas of the original are made oleophilic and the exposed areas remain hydrophilic and greasy ink-repellent.

Such a special photographic silver halide material having a rather complicated structure as compared with a common photographic silver halide material is described in the U.K. Pat. Spec. No. 978,744 filed Dec. 21, 1960 by Kodak, Limited. The material has a surface layer, which is a fogged silver halide emulsion layer, and between said layer and the support a light-sensitive silver halide emulsion of the negative type, which itself has been coated onto a colloid layer containing a tanning-developing agent.

Upon image-wise exposure followed by alkaline activation the developing agent, which has not been utilized in developing the silver halide emulsion layer of the negative type, diffuses into the fogged surface silver halide emulsion layer and produces therein a positive silver image, which is already greasy ink-accepting though this greasy ink-acceptance has still to be improved yet with a special acidic "stop-bath" e.g. as described in the U.K. Pat. Spec. 1,093,646 filed Apr. 22, 1965 by Kodak, Limited.

Another special photographic material suited for producing a positive planographic printing plate according to the wellknown silver complex diffusion transfer process is described in the U.K. Pat. No. 1,241,661 filed June 19, 1967 by Gevaert-Agfa N.V.

According to the process defined therein, a silver image is formed according to the silver complex diffusion transfer process on an outer hardenable hydrophilic colloid layer. The silver image is oxidized at least superficially with cyanoferrate(III) ions and the oxidized silver is rendered hydrophobic with e.g. an organic thione compound.

According to the published German Pat. No. 2,244,236 filed Sept. 8, 1972 by Kodak, Limited the oleophilization of a silver image obtained according to the silver complex diffusion transfer process proceeds with an aqueous acidic liquid containing iodide ions and a long chain cationic organic compound and in admixture therewith a heterocyclic organic compound comprising a nitro-substituted aromatic nucleus or a cationic organic compound with an aromatic group that does not comprise a nitro group.

In the discussed photographic materials a suitably prepared surface layer containing either fogged silver halide or developing nuclei for the silver complexes has to be present.

It is one of the objects of the present invention to provide a method for the production of a planographic printing plate starting from a photographic silver halide emulsion material that can be of the negative or of the direct-positive type.

It is a further object of the present invention to provide a method for the production of a planographic printing plate in which a common developing agent may be used, and no oxidizing liquid for the desired image-wise oleophilization of the plate has to be used.

It is another object of the present invention to provide a high quality litho plate for screen and line work according to a rapid access process that can be fully automated.

Further objects, features, and advantages of the present invention will become apparent upon consideration of the following disclosure.

A method has been found for the preparation of a planographic printing plate containing the steps of:
  information-wise photo-exposing a photographic material containing a silver halide emulsion layer in which the silver halide is present in a water-permeable colloid binder,
  developing the information-wise photo-exposed photographic silver halide material, and
  treating said material containing a pattern of poorly water-soluble silver salt with an aqueous liquid (hereinafter called lithographic liquid) which contains in dissolved state an organic cationic compound or mixture of organic cationic compounds, iodide ions, and a sufficient amount of hydronium ions ($H_3O^+$) for creating an acidic medium, said liquid being capable of making an unexposed and undeveloped photographic silver halide material as defined hereinafter sufficiently receptive for a lithographic ink to form on a lithographic press in printing position with a lithographic ink as defined hereinafter an ink deposit on paper used in lithographic printing of a spectral density of at least 0.5 measured at the absorption maximum of the ink, wherein the lithographic ink receptance of the photographic material has to be obtainable by overall contacting said material for 30 sec at 22° C with said liquid; said unexposed and undeveloped photographic material contains on a flexible resin or paper support a silver halide emulsion layer with the following characteristics:
  1. the silver halide grains of the emulsion layer are silver chlorobromide grains (75:25 mole % chloride to bromide)
  2. average grain size of the silver halide is 0.35 micron,
  3. the silver halide coverage expressed in silver nitrate is 10 g per sq.m.,
  4. the ratio by weight of gelatin to silver halide expressed as silver nitrate is 5.8:10, 5. the thickness of the emulsion layer is 8 microns and the emulsion layer is coated with an anti-abrasion layer having a thickness of 0.6 micron and containing gelatin, silica particles, and formaldehyde, the formaldehyde being added to the coating composition of the anti-abrasion layer in a weight ratio of 6:100 with respect to the gelatin, the silica particles having an average grain size of 5 microns, the coverage of silica particles being 0.01 g per sq.m., and the gelatin coverage being 0.6 g per sq.m.;

Said lithographic ink has the following composition:

|  | parts by weight: |
|---|---|
| Lake Red C (C.I. 15,585) | 80 |
| styrenated linseed-tung oil alkyd of 60 per cent oil length and 10 per cent styrene content | 100 |
| aliphatic petroleum having a boiling range of 260–290° C | 50 |
| lead metal (as naphthenate) | 1 |
| cobalt metal (as naphthenate) | 0.12 |

A class of organic cationic compounds representing a great number of compounds suited for use according to the invention, is the class of the organic onium compounds. Preference is given to organic ammonium, organic sulfonium, and organic oxonium compounds.

The class of organic cationic compounds carrying on the positive heteroatom e.g.

a free hydrogen atom comprises a much smaller amount of compound that are appropriate for the purpose of the present invention.

Preferably, use is made of an acid aqueous lithographic solution containing as principal ingredients iodide ions and at least one organic onium compound corresponding to one of the following general formulae:

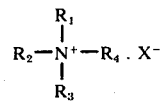 (1)

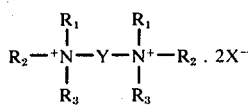 (2)

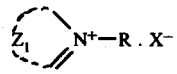 (3)

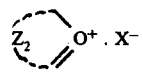 (4)

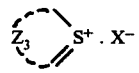 (5)

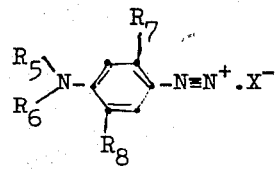 (6)

wherein:

each of $R_1$, $R_2$, $R_3$ and $R_4$ (same or different) represent an aliphatic group including a substituted aliphatic and cycloaliphatic group, said groups having not more than 5 carbon atoms in straight line e.g. a $C_1$-$C_5$ lower alkyl group, a substituted lower alkyl group e.g. a halogen-substituted lower alkyl group, an aryl-substituted lower alkyl group e.g. a phenylmethyl group, a naphthylmethyl group or a halogenophenylmethyl group, or $R_1$ and $R_2$ together represent the necessary methylene groups or such groups interrupted by oxygen or

to close a 5- or 6-membered nitrogen-containing heterocyclic nucleus e.g. a pyrrolidine, piperidine, morpholine, or piperazine nucleus, Y represents an organic bivalent group containing at maximum 10 carbon atoms in straight line, $Z_1$ represents the necessary atoms to close a 5- or 6-membered nitrogen-containing heterocyclic nucleus e.g. a benzothiazolium, indoleninium, benzimidazolium, tetrazolium, quinoxalinium, pyridinium or quinolinium nucleus including these nuclei in substituted form, R represents an aliphatic group including a substituted aliphatic and cycloaliphatic group, said groups having not more than 8 carbon atoms in straight line e.g. a $C_1$-$C_8$ lower alkyl group, a substituted lower alkyl group e.g. a hydroxyethyl group, a sulphopropyl group or an aryl-substituted lower alkyl group e.g. a phenylmethyl (i.e. benzyl) or naphthylmethyl group wherein the aromatic nucleus is optionally halogen-substituted, $Z_2$ represents the necessary atoms to close a pyrylium nucleus including said nucleus in substituted form and in condensed form with an aromatic nucleus e.g. a benzopyrylium nucleus, $Z_3$ represents the necessary atoms to close a thiapyrylium nucleus including said nucleus in substituted form and in condensed form with an aromatic nucleus, each of $R_5$ and $R_6$ (same or different) represent hydrogen or a $C_1$-$C_2$ alkyl group, each of $R_7$ and $R_8$ (same or different) represent hydrogen or a $C_1$-$C_4$ alkoxy group, $X^-$ represent one or more anions in a number equivalent to that of the onium groups in the onium compounds, but $X^-$ is missing when the anion is already contained in the R substituent (betaine salt form).

Suitable substituents of the heterocyclic nuclei of the onium compounds according to the general formula (3) are e.g. methyl, ethyl, alkoxy e.g. methoxy, hydroxy, cyano, sulphamoyl, sulphopropyl, cyclohexyl, phenyl, and tolyl.

According to a modified embodiment of the invention, said aqueous lithographic liquid does not contain the above-mentioned hydronium ions in other words it is not acidic. In this case a useful fatty ink acceptance is only obtained, when the treatment with the aqueous liquid containing iodide ions and at least one of said cationic compounds is preceded by a treatment of the photo-exposed silver halide material with an acidic aqueous solution, e.g. an acid stop-bath as is commonly used in the processing of photo-exposed silver halide materials.

According to the process of the present invention not the areas of the photographic material corresponding with the silver metal image but the areas containing poorly water soluble silver salt, preferably silver halide, are made accepting fatty ink.

Thus, a positive-working printing master is obtained by image-wise exposing a silver halide material of the negative type, developing it, and treating it afterwards with the above aqueous liquid. In this way the non-photoexposed i.e. non-silver image areas obtain the property of accepting a fatty ink used in planographic printing.

A negative-working printing master is produced by image-wise exposing and than developing a silver halide material of the direct-positive type and treating it then with the above aqueous liquid. The non-silver image areas, which now correspond with the photo-exposed parts become selectively accepting the fatty ink.

According to a modified embodiment the development of the photographic silver halide material is not immediately followed by a treatment with said aqueous lithographic liquid but the exposed silver halide emulsion layer e.g. of the negative type is fixed after having been developed. The remaining silver image is re-oxidized and re-halogenated. This may proceed by a treatment with an aqueous solution containing cyanoferrate(III) ions and bromide ions. By the latter reactants the silver is rehalogenated according to the following reaction scheme:

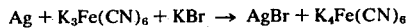

$$Ag + K_3Fe(CN)_6 + KBr \rightarrow AgBr + K_4Fe(CN)_6$$

The thus processed photographic material containing now in the originally photo-exposed areas a poorly water-soluble silver salt is then treated with the above-described aqueous lithographic liquid to make these areas receptive towards fatty ink.

By the wording "poorly water-soluble silver salt" a silver salt is meant, the solubility of which in water at 20° C is below about $9.10^{-4}$ g per 100 ml of water.

In the present process for preparing a planographic printing master the silver halide emulsion materials are preferably of the type wherein the silver halide grains do not contain or only contain a minor amount of silver iodide (preferably not more than 5 mole %).

Suitable for application in the present invention are silver halide emulsion materials capable of reproducing a step wedge original in such a way that the resulting print has a gamma of at least 3.

According to a preferred embodiment so-called "lith-emulsion materials" of the negative and direct-positive type are used. In these materials silver chloride, silver chlorobromide, silver bromide or silver chlorobromoiodide type grains (normally containing less than 5 mole % of iodide) are used. These silver halide emulsion materials are capable of yielding steep-gradation images (gamma value above 10) when developed in a lith developer and they are especially useful for the reproduction of graphic line or screen images.

Suitable direct-positive silver halide emulsions are those forming a positive silver image and a corresponding image-wise distribution of developer oxidation products during development. Such silver halide emulsions are e.g. those in which a developable fog is obtained by exposure or chemical treatment, which fog is destroyed image-wise in certain conditions during the image-wise exposure. The fog remains at the unexposed areas so that during the subsequent development a direct-positive silver image is obtained.

Positive photographic images can be obtained without previously forming a negative silver image, by applying e.g. the solarization effect and the Herschel effect.

Solarization is a reversal phenomenon, which is produced by over-exposure of a silver halide emulsion layer. It is assumed that said over-exposure results in the destruction of previously formed developing centres. The preparation of a solarized emulsion for the production of direct positives consists in producing a uniform latent image corresponding to the critical exposure. This can be realized by overall exposing the light-sensitive emulsion to actinic light or by appropriate overall chemically fogging it with reducing substances.

According to the Herschel effect a latent image can be reversed by a second exposure to red light or infrared radiation. The sensitive layer is first fogged uniformly to its maximum density with blue-violet light and is image-wise exposed e.g. through a positive transparency, with light of a wavelength greater than 600 nm, preferably at low intensity and for a long time. If the photographic material is treated with a so-called "densensitizing dye," the Herschel effect may be obtained with light of a shorter wavelength such as yellow light.

Suitable direct positive photographic materials are described e.g. in the U.S. Pat. Nos. 3,501,310 of Bernard D. Illingworth issued Mar. 17, 1970, 3,567,456 of Oskar Riester, Wolfgang Lassig and August Randolph, issued Mar. 2, 1971 and 3,615,610 of Raymond Leopold Florens, Johannes Gotze, August Randolph and Theofiel Hubert Ghys issued Nov. 26, 1971 and in the U.K. Pat. Application No. 9105/74 filed Feb. 28, 1974.

A further group of direct-positive silver halide emulsions used preferably according to the invention comprises the so-called unfogged direct-positive silver halide emulsions, which have their sensitivity predominantly in the interior of the silver halide grains. During the image-wise exposure of these emulsions a latent image forms mainly in the interior of the silver halide grains. The development of such unfogged direct-positive silver halide emulsions is carried out in fogging conditions anyway, the fogging occurring mainly in the unexposed areas and a positive silver image being formed during developement.

The selective fogging of the image-wise exposed unfogged direct-positive emulsions can be carried out before or during the development by treatment with a fogging agent. Suitable fogging agents are reducing agents such as e.g. hydrazine and substituted hydrazines. There can be referred in this respect to e.g. the U.S. Pat. No. 3,227,552 of White More issued Jan. 4, 1966.

Unfogged direct-positive emulsions are e.g. those showing defects in the interior of the silver halide grains (see U.S. Pat. Nos. 2,592,250 of Edward Philip Davey and Edward Bowes Knott issued Apr. 8, 1952) or silver halide emulsions with a stratified grain structure (see the published German Pat. No. 2,308,239 filed Feb. 20, 1973).

For developing silver halide materials suitable for application in the present invention any developer can be used that is capable of offering with the above-defined photographic silver halide materials a photographic print with a gamma of at least 3.

By a lith-type developer that is particularly useful in the preparation of printing masters according to the present invention, an aqueous developing solution is meant, which contains as essential developing substance a p-dihydroxybenzene developing agent, preferably hydroquinone, and as anti-oxidant a hydrogen sulphite addition compound of an aliphatic aldehyde or ketone, e.g. formaldehyde hydrogen sulphite.

In the process of the present invention the developer may contain in addition to a p-dihydroxybenzene developing agent an auxiliary developing agent e.g. a monomethyl-p-aminophenol type developer and/or a 3-pyrazolidinone type developer. Normally a lith developer composition does not contain more than 0.05 g per liter of the auxiliary developing agent(s) but in the present invention this amount may be surpassed.

A suitable concentration of p-dihydroxybenzene developing agent for use in the present invention is in the range of about 0.05 to about 0.50 mole per litre, more preferably in the range of about 0.10 to about 0.30 mole per litre.

In a preferred embodiment of the present invention the total amount of developing substance(s) is incorporated in the photo-sensitive material and the development is carried out with a so-called "activator liquid", which is an aqueous solution of alkaline substance(s) providing the necessary increase in pH to start and maintain the reduction of the developable silver halide with the mentioned developing agent(s).

The p-dihydroxybenzene developing agent alone or a mixture of said developing agent with an auxiliary developing agent e.g. 1-phenyl-3-pyrazolidinone is preferably used in a water-permeable colloid layer that is adjacent to the silver halide emulsion layer e.g. in a subjacent anti-reflection layer or on top of the emulsion layer e.g. in an anti-abrasion layer.

In a particular embodiment the photographic silver halide material contains e.g. from about 200 mg to about 3 g per sq.m. of hydroquinone and optionally in addition thereto e.g.. about 5 to about 400 mg per sq.m. of a 3-pyrazolidinone auxiliary developing agent.

When the developing substances are present in the photographic material preservatives are preferably added thereto. For example, formaldehyde-hydrogensulphite and potassium metabisulphite. Other optionally used ingredients are coating aids for one or more water-permeable layers of the light-sensitive material, e.g. stabilizers, development accelerators, spectral sensitizing agents, preservatives, latices, dispersing agents, wetting aids, and hardeners e.g. formaldehyde. The use of a hardener is important, since it provides a so much desired resistance to wear to the printing plate.

The binder for the light-sensitive material is preferably gelatin, but may be replaced wholly or partly by other natural and/or synthetic hydrophilic colloids e.g. albumin, casein or zein, polyvinyl alcohol, sodium salts of alginic acids, sodium salts of cellulose derivatives such as sodium salt of carboxy methyl cellulose.

The ratio by weight of water-permeable colloid binder, preferably gelatin, to silver halide may vary within broad ranges, preference being given however, to a weight ratio of colloid binder to silver halide expressed as silver nitrate of about 6:10.

Preferred silver halide emulsion layers have a coverage of silver halide per sq.m. corresponding with an equivalent amount of silver nitrate varying between 1 to 10 g per sq.m.

The support for the light-sensitive silver halide emulsion layer may be of any of the supports customarily employed in the art. For example the supports are supports of paper, resin film or metal sheets. Suitable resin supports are e.g. cellulose acetate film, polyvinyl acetal film, and polyester resin film e.g. polyethylene terephthalate film. The paper supports are preferably coated on both sides with an alphaolefin polymer e.g. polyethylene. Metal supports or sheets are preferably made of aluminium and may be laminated on one or both sides with paper.

An improvement in gradation, relative speed, and maximum density is obtained in case there is rapid development of the image-wise photo-exposed light-sensitive recording material according to the U.S. Pat. No. 3,637,389 of Emiel Alexander Hofman issued Jan. 25, 1971. Thus, the photographic silver halide materials used in the present invention may contain at least one water-permeable layer essentially composed of a hydrophilic colloid (preferably of the proteinaceous type e.g. gelatin), which is interposed between the support e.g. a resin film support and the silver halide emulsion layer and is in direct contact with the emulsion layer. Preferably the total weight of such water-permeable layer(s) is at least about 2 g per sq.m up to about 8 g per sq.m.

The photographic image sharpness and, as a consequence thereof, the sharpness of the final result of printing can be improved by applying visible light-absorbing dyes, so-called antireflection dyes or pigments. These dyes or pigments may be present in the silver halide emulsion layer or in the support, but preferably in a layer called anti-reflection layer between the silver halide emulsion layer and the support. If a transparent support is used, the antireflection dyes or pigments, may be applied to the rear side of the material or on top of the emulsion layer dependent on the manner in which the exposure is carried out, viz. at the front side or through the support. The thickness of the dry anti-reflection layer is preferably in the range of 4 to 15 microns. This layer as already mentioned is preferred for the incorporation of the developing substances. Preferably a red or black antireflection dye or pigment is used.. A suitable black pigment is lamp black.

The light-sensitive emulsion layer is preferably coated with a water-permeable colloid layer e.g. anti-abrasion layer comprising a sufficiently hardened hydrophilic water-permeable colloid e.g. gelatin and optionally containing a known matting agent e.g. silica particles that are optionally enveloped with an urea-formaldehyde resin. The silica particles have e.g. a mean grain size diameter of 5 microns and are present with respect to the gelatin colloid binder in a weight ratio of about 1 to 60. The thickness of the anti-abrasion layer is rather small preferably e.g. 0.02 $\mu$ to 1 $\mu$.

The aqueous treating liquid used for hydrophobizing the parts of the photographic material that correspond with the undeveloped silver halide has e.g. an iodide ion content from about $10^{-2}$ mole to 1 mole per liter. The iodide is preferably incorporated at least partly in the form of an alkaline iodide e.g. in the form of potassium iodide into the treating liquid.

Optionally the aqueous lithographic liquid contains thiosulphate ions in an amount preferably from about $10^{-2}$ mole to about $10^{-1}$ mole per litre. The thiosulphate incorporated in the treating liquid is preferably an alkaline thiosulphate such as ammonium thiosulphate or sodium thiosulphate.

The pH of the lithographic liquid of the present invention is e.g. in the range of about 1.0 to about 6.5. Preferably the pH is not below 3 but buffered in the range of 4.0 to 5. Acids such as acetic acid, citric acid, orthophosphoric acid as well as acid-reacting salts e.g. sodium hydrogen sulphate and sodium dihydrogen phosphate are suitable for use as buffering substance in the acid treating liquid.

The onium ions of the organic onium compound are preferably present in the lithographic liquid in an amount inferior to that of the iodide ions e.g. in a ratio of about 1:2 in respect of the iodide ions. The content of organic onium compound in the treating liquid is preferably from about $10^{-2}$ mole per liter to about $10^{-1}$ mole per liter but may be less depending on the type of onium compound or mixture of onium compounds used. When thiapyrylium compounds are used, there should be added a suitable amount of water-miscible solvent (e.g. dimethylformamide) to dissolve them in aqueous medium.

In the following table a list of organic onium compounds that are particularly suited for the purpose of the present invention is given.

Table

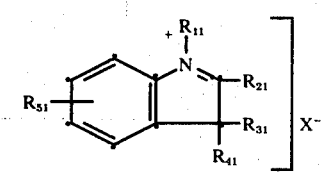

| No. of the compound | $R_{10}$ | $R_{20}$ | $R_{30}$ | X | Melting point |
|---|---|---|---|---|---|
| 1 | $CH_3$ | $C_2H_5$ | H | I | 188° C |
| 2 | $CH_3$ | $CH_3$ | H | $CH_3SO_4$ | 140° C |
| 3 | $CH_3$ | $CH_2CH_2OH$ | 5,6-di$CH_3$ | Br | 242° C |
| 4 | $CH_3$ | $C_2H_5$ | 5,6-di$CH_3O$ | $C_2H_5SO_4$ | 152° C |
| 5 | $CH_3$ | $C_2H_5$ | 5-$CH_3$ | $C_2H_5SO_4$ | 132° C |
| 6 | $CH_3$ | $CH_3$ | H | p-TolSO$_3$ | 190° C |
| 7 | $CH_3$ | $C_2H_5$ | 5,6-di$CH_3O$ | I | 230° C |

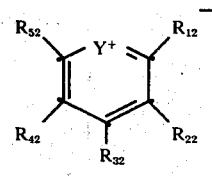

| No. of the compound | $R_{11}$ | $R_{21}$ | $R_{31}$ | $R_{41}$ | $R_{51}$ | X | Melting point |
|---|---|---|---|---|---|---|---|
| 8 | $CH_3$ | $CH_3$ | $CH_3$ | $CH_3$ | H | I | 250° C |
| 9 | $CH_2CH_2OH$ | $CH_3$ | $CH_3$ | $CH_3$ | H | Br | 194° C |
| 10 | $CH_3$ | $CH_3$ | $CH_3$ | $CH_3$ | 5-OH | I | 260° C |
| 11 | $CH_3$ | $CH_3$ | $CH_3$ | $CH_3$ | 5-$SO_2NH_2$ | I | 264° C |
| 12 | H | $CH_3$ | $CH_3$ | $CH_3$ | H | I | not isolated (used after preparation) |

| No. of the compound | $R_{12}$ | $R_{22}$ | $R_{32}$ | $R_{42}$ | $R_{52}$ | Y | X | Melting point |
|---|---|---|---|---|---|---|---|---|
| 13 | —N(morpholino) | phenyl | H | H | phenyl | S | ClO$_4$ | 196 |
| 14 | —N(pyrrolidino) | phenyl | H | H | phenyl | S | ClO$_4$ | 160 |

Table-continued

| 15 | -N(H)-C6H10- (piperidinyl-phenyl) | H | H | phenyl-CH3 | S | ClO4 | 194 |
| 16 | CH3 | H | CH3 | -C(H)=C(H)-C(H)=C(H)- | O | Cl | 190 |

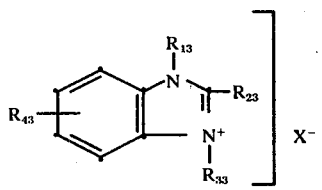

| No. of the compound | R13 | R23 | R33 | R43 | X | Melting point |
|---|---|---|---|---|---|---|
| 17 | $C_2H_5$ | $CH_3$ | $(CH_2)_4SO_3^-$ | 5-CN | — | over 260° C |
| 18 | $C_2H_5$ | $CH_3$ | $CH_2CH_2OH$ | 5-CN | Br | over 260° C |

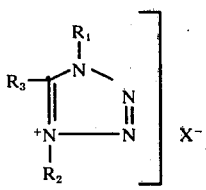

| No. of the compound | R1 | R2 | R3 | X | Melting point |
|---|---|---|---|---|---|
| 19 | phenyl (H) | $CH_3$ | $CH_3$ | I | over 260° C |
| 20 | o-tolyl ($CH_3$) | $C_2H_5$ | $CH_3$ | I | 163° C |
| 21 | phenyl | $CH_3$ | $CH_3$ | I | 230° C |

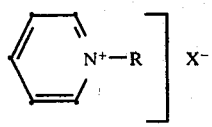

| No. of the compound | R | X | Melting point |
|---|---|---|---|
| 22 | phenyl-$CH_2$ | Cl | hygroscopic |
| 23 | phenyl-$CH_2$ | Br | — |

Table-continued

| No. | Structure | | |
|---|---|---|---|
| 24 | (benzyl group) -CH₂- | p-TolSO₃ | 120° C |

[Structure: quinolinium with R₁ on N⁺, R₂ at 2-position, X⁻ counterion]

| No. of the compound | R₁ | R₃ | X | Melting point |
|---|---|---|---|---|
| 25 | $C_2H_5$ | $CH_3$ | I | 226° C |
| 26 | $CH_3$ | H | $CH_3SO_4$ | 102° C |
| 27 | $CH_3$ | $CH_3$ | I | 195° C |
| 28 | $CH_3$ | $CH_3$ | $CH_3SO_4$ | 223° C |

[Structure: $R_2-N^+(R_1)(R_3)-(CH_2)_n-N^+(R_1)(R_3)-R_2$ · 2X⁻]

| No. of the compound | R₁ | R₂ | R₃ | n | X | Melting point |
|---|---|---|---|---|---|---|
| 29 | $CH_3$ | $CH_3$ | $CH_3$ | 5 | Br | over 260° C |
| 30 | $CH_3$ | $CH_3$ | $CH_3$ | 6 | Cl | over 260° C |

[Structure: $R_1R_2N$–C₆H₄–$N_2^+$ · $ZnCl_{2+n}$]ₙ

| No. of the compound | R₁ | R₂ | n | Melting point |
|---|---|---|---|---|
| 31 | $CH_3$ | $CH_3$ | 2 | dec. >100° C |
| 32 | $C_2H_5$ | $C_2H_5$ | 1 | dec. >100° C |

| No. of the compound | Formula | Melting point |
|---|---|---|
| 33 | [phenyl]–$CH_2N^+(CH_3)_3Cl^-$ | 70–75° C |
| 34 | [quinoxalinium with $C_2H_5$ on N⁺, I⁻] | 146° C |

The compounds listed in the Table I can be prepared as follows. Sometimes the literature sources of the preparation are given.

Preparation of compound 1

1 mole of 2-methyl-benzothiazole and 1.25 mole of ethyl iodide were heated in an autoclave at 100° C for 24 hours. The product was washed with acetone. Melting point: 188° C.

Preparation of compound 2

0.9 mole of dimethylsulphate were added dropwise to 1 mole of 2-methyl-benzothiazole dissolved in 150 ml of dry boiling toluene. The mixture was refluxed for 45 minutes. After cooling, the precipitate was isolated, washed with acetone, and recrystallized from ethanol.
Melting point: 140° C.

Preparation of compound 3

A mixture of 0.6 mole of 2,5,6-trimethyl-benzothiazole and 0.72 mole of 2-bromoethanol was heated for 6 h at 130° C. The crystalline mass was boiled with 100 ml of acetone, filtered, and washed with 100 ml of acetone and 100 ml of ether.
Melting point: 242° C.

Preparation of compound 4

0.1 mole of 2-methyl-5,6-dimethoxy-benzothiazole and 0.09 mole of diethyl sulphate in 100 ml ethanol were refluxed for 8 hours. The solvent was evaporated and the residue was washed with acetone and recrystallized from ethanol.
Melting point: 152° C.

Preparation of compound 5

A mixture of 0.2 mole of 2,5-dimethylbenzothiazole and 0.24 mole of diethyl sulphate in 40 ml of dry toluene were kept at 100° C for 6 hours. After cooling, the crystals were filtered and washed with dry ether.
Melting point: 132° C.

Preparation of compound 6

149 g (1 mole) of 2-methyl-benzothiazole and 223.2 g (1.2 mole) of p-toluenesulphonic acid methyl ester were dissolved in toluene (1.5 liter) and heated at 130° C for 24 hours under nitrogen atmosphere. After cooling, the precipitate was filtered off and washed with acetone.
Melting point: 190° C. yield: 84 % (280 g).

Preparation of compound 7

Step 1

2,2'-dinitro-4,5-4',5'-tetramethoxy-diphenyl disulphide (I)

1,2-dimethoxy-4,5-dinitro-benzene (II) was prepared as described by Drake et al., J. Am. Chem. Soc. 68 (1946) p. 1541.

A mixture of methanol (500 ml), $Na_2S.9\ H_2O$ (326 g - 1.2 mole) and sulphur (44 g - 1.16 mole) was refluxed for 1 hour. This gave solution A.

Solution A was added in a period of 1 hour to a refluxing solution of II (620 g - 2.72 moles) in methanol (3.5 l). The mixture was refluxed for another 1½ hour. After cooling, the precipitate was filtered and washed with methanol and hot water. The product was dried at 70° C.
Melting point: 228° C. yield: 83 % (485 g).

Step 2

2-methyl-5,6-dimethoxy-benzothiazole (III)

A suspension of I (965 g - 2.25 moles) in acetic anhydride was put in an autoclave and mixed with rhenium heptasulfide ($Re_2S_7$) (7.5 g) and another 500 ml of acetic anhydride. The apparatus was brought under a pressure of 1500 psi $H_2$ and slowly heated to 120° C with shaking. The temperature was raised to 150° C. After 5 hours, the absorption of hydrogen ceased. The mixture was filtered, the filtrate was concentrated at normal pressure until the residue reached a temperature of 150° C. The remaining anhydride was removed in vacuo. The crude product was distilled.

Boiling point: 158°–164° C/2 mm Hg. Melting point: 70° C. yield: 83 % (781 g).

Step 3 compound 7

A solution of III (104.5 g - 0.5 mole) and ethyl iodide (78 g - 0.5 mole) in nitro methane (200 ml) was refluxed for 24 hours while stirring. After cooling, the precipitate was filtered, washed with dry ether and crystallized from methanol.
Melting point: 230° C. Yield: 76 % (139 g).

Preparation of compound 8

1 mole of 2,3,3-trimethyl-indolenine and 1.3 mole of methyl iodide in 200 ml of acetone were refluxed for 4 h. After cooling, the crystals were filtered and purified by vapour extraction with ethanol.
Melting point: 250° C.

Preparation of compound 9

1 mole of 2,3,3-trimethyl-indolenine and 1 mole of 2-bromo-ethanol in 1000 ml of n-butanol were refluxed for 15 hours. The cooled mixture was poured in 6 liters of ether. The crystals were filtered and recrystallized from ethanol.
Melting point: 194° C.

Preparation of compound 10

Step 1

2,3,3-trimethyl-5-methoxy-indolenine (I)

A mixture of 0.18 mole of 4-methoxy-phenylhydrazine, 0.27 mole of methyl-isopropyl ketone, five drops of acetic acid and 300 ml of ethanol was refluxed for 3 hours and then the solvent was evaporated. The dark residue (28 g of hydrazone) was dissolved in 125 ml of ethanol. After adding 54 ml of a 15 % by weight solution of concentrated sulphuric acid in ethanol the mixture was refluxed for 2.5 hours. The white precipitate (ammonium sulphate was filtered and the filtrate was diluted with 750 ml of water, neutralized with a few ml of aqueous 5N NaOH and extracted with ether. The dried extract was distilled in vacuo.
Boiling point: 138°–142° C/8 mm Hg.

Step 2

2,3,3-trimethyl-5-hydroxy-indolenine (II)

0.1 mole of (I) was dissolved in a mixture of 80 ml of acetic acid and 80 ml of aqueous hydrobromic acid (48 % by weight), refluxed for 8 hours and then diluted with 250 ml of water. The solution was neutralized with 115 ml of ammonia (23 % by weight). The precipitate was isolated, washed with water, and dried.
Melting point: 185° C.

Step 3 compound 10

0.1 mole of (II) and 0.2 mole of methyl iodide in 200 ml of methanol were refluxed for 15 hours. The cooled solution was diluted with 1 liter of ether, the precipitate was filtered, and crystallized from ethanol.
Melting point: 260° C.

Preparation of compound 11

Step 1

2,3,3-trimethyl-5-sulphonamido-indolenine(I) was prepared by condensing 0.25 mole of p-sulphonamido-hydrazobenzene with 0.4 mole of methyl-isopropyl ketone in 550 ml of methyl glycol and 1 ml of acetic acid by boiling for 1 hour. After evaporation of the solvent, the hydrazone (20 g) was stirred with 70 ml of $H_2SO_4$ (70 % by weight) at 100° C for 3.5 hours.

The dark red solution was cooled and alkalized with KOH. The brown precipitate was filtered and crystallized from ethanol over charcoal.

Melting point: 231° C.

Step 2

0.2 mole of (I) and 0.24 mole of methyl iodide in 1 liter of methanol were refluxed for 15 hours, cooled, and diluted with 3 liters of ether. The precipitate was crystallized from methanol over charcoal.

Melting point: 264° C.

Preparation of compound 12

2,3,3-trimethyl-indolenine was dissolved in water containing an equivalent amount of hydroiodic acid. The obtained reaction product was not isolated and used as such in the aqueous medium.

Compound 13 was prepared according to J.pr.Ch. 313 (6) (1971) p. 1113–7.

Compounds 14 and 15 were prepared analogously to compound 13.

Compound 16 was prepared according to J. Nauk. Prikl. Photo Kh. 9 (1964) p. 209–10.

Preparation of compound 17

Step 1

3-nitro-4-chloro-benzoyl chloride (I) was prepared by refluxing for 4 hours a cautiously prepared mixture of 3-nitro-benzoic acid (113 g - 0.56 mole) and thionyl chloride (115 ml - 1.58 mole). The surplus $SOCl_2$ was then removed in vacuo and the residue crystallized from n-hexane.

Melting point: 50° C. Yield: (109 g).

Step 2

3-nitro-4-chloro-benzamide (II)

A solution of I (220 g - 1 mole) in acetone (210 ml) was added dropwise with stirring to 500 ml of aqueous ammonia 25 % by weight. The temperature was kept below 30° C by ice/salt. After the addition of 700 ml of water, the precipitate was filtered, dried at 80° C, and crystallized from 1 liter of methanol. Melting point: 153° C. Yield: 85 % (172 g).

Step 3

3-nitro-4-(N-ethylamino)-benzamide (III).

II (160 g - 0.8 mole) was added portionwise with stirring at 60° C to 720 g of 50 % by weight aqueous ethylamine. The mixture was cooled, the precipitate was collected and crystallized from the monomethyl ether of ethylene glycol (5 ml per gram of dried product).

Melting point: 226° C. Yield: 88 % (147 g).

Step 4

1-ethyl-2-methyl-5-carbamyl-benzimidazole (IV)

A mixture of III (125 g - 0.6 mole), acetic anhydride (214 g - 2.1 moles), Raney Nickel (1.2 ml) and acetic acid (36 g - 0.6 mole) was hydrogenated at 80° C and a pressure of 100 to 30 atm. Reaction time: 5 hours. After cooling, the catalyst was filtered, the filtrate was concentrated by normal pressure until 135 ml of distillate were collected. 150 ml of $H_2SO_4$ 6N were added to the residue. The reaction was very exothermic. The solution was refluxed with active carbon for 15 min. and filtered. The filtrate was mixed with 1.2 kg of ice and exactly neutralized with 2N NaOH. The precipitate was washed with water and dried at 100° C.

Melting point: 251° C. Yield: 88 % (108 g).

Step 5

1-ethyl-2-methyl-5-cyano-benzimidazole (V)

Phosphorus oxychloride ($POCl_3$) (42.4 ml - 0.44 mole) was added to a stirred and ice-cooled solution of IV (81.2 g - 0.4 mole) in pyridine (160 ml). The temperature reached 45° C. After this addition, the mixture was heated to 60° C. The reddish-brown oil was poured immediately in 1 kg of ice/water with stirring. The precipitate was filtered, washed with ice-cold water, and dried. The crude product was crystallized from pyridine (1.5 ml/g) and water (9 ml/g).

Melting point: 162° C. Yield: 61 % (452 g).

Step 6

1-ethyl-2-methyl-3-(4'-sulfobutyl)-5-cyano-benzimidazole 18.6 g - 0.1 mole of V and 1,4-butanesultone were heated at 140° C for 4 hours, then washed with acetone, and dried.

Melting point: over 260° C. Yield: 72 % (23 g).

Preparation of compound 18

18.5 g of V (step 5, compound 17) and 2-bromo-ethanol (12.5 g - 0.1 mole) were heated for 4 hours at 110° C, washed with acetone and dried. Melting point: over 260° C. Yield: 72 % (29 g).

Preparation of compound 19

1-cyclohexyl-5-methyl-tetrazole (I) was prepared as described in the J. Org. Chem. 15 (1950) p. 668.

I (8.3 g - 0.05 mole) and methyl iodide (7.81 g - 3.5 moles) were heated in a sealed tube for 24 hours at 110° C. The crude product was washed with acetone and dried.

Melting point: over 260° C. Yield: 93 % (14.3 g).

Preparation of compound 20

Step 1

1-(o-tolyl)-5-methyl-tetrazole (I)

o-Toluidine (53.5 g - 0.5 mole), HCl 35 % by weight (140 ml) and 200 g of ice were mixed, diazotized with $NaNO_2$ (34.5 g), neutralized with 5N NaOH to pH 6 and filtered. This gave solution A.

1,2-Diacetylhydrazine (58 g - 0.5 mole) and $Na_2CO_3$ (26.5 g) were dissolved in water (500 ml) and cooled to 0° C. The solution A was added dropwise with stirring at 0° C. A yellow tacky precipitate was formed. 5N NaOH (1 liter) was added at 0° C. The precipitate became a dark oil.

After 24 hours at room temperature, the aqueous layer was separated from the oily precipitate, which solidified by washing with ether.

Melting point: 84° C. Yield: 10 % (8.5 g).

Step 2

Compound 20

I (7.5 g - 0.043 mole) and ethyliodide (4.2 ml) were heated in a sealed tube for 24 hours at 150° C, then washed with ether and dried.

Melting point: 163° C. Yield: 85 % (12 g).

Preparation of compound 21

1-phenyl-5-methyl-tetrazole (I) was prepared as described in Ber. 43 (1910) p. 2904.

I (16 g - 0.1 mole) and methyl iodide (7 ml) were heated in a sealed tube at 110° C for 24 hours. The crude product was washed with acetone and dried.

Melting point: 230° C. Yield: 90 % (28 g).

Preparation of compound 22

Benzyl chloride (126.5 g - 1 mole) was dissolved in pyridine (250 ml) and heated at 85°–90° C for 2 hours. The mixture solidified on cooling and was washed with acetone. Yield: 87 % (180 g). The product is very hygroscopic and water should be rigorously excluded during the preparation.

Preparation of compound 23

To a stirred, refluxing solution of pyridine (80 ml - 1 mole) in acetone (250 ml), benzylbromide (130 ml - 1.1 mole) was added dropwise. After the addition, the mixture was refluxed for 2 hours, cooled and the precipitate was collected and washed with acetone.

Melting point: 94° C. Yield: 90 % (225 g). The product is hygroscopic.

Preparation of compound 24

A mixture of p-toluenesulphonic acid-benzyl ester (300 g - 1.15 mole), pyridine (90 g - 1.15 mole), and acetone (500 ml) was refluxed for 8 hours, filtered, cooled, and diluted with ether (1 liter). The precipitate was isolated and crystallized from acetone (4 liters).

Melting point: 120° C. Yield: 57 % (224 g).

Compound 25: prepared as described by W. Spaltenholz, Ber. 16 (1883) p. 1851.

Compound 26: according to the method described by J. Willems and J. Nys, Bull. Soc. Chim. Belges 66 (1957) p. 502–11.

Compound 27: as described by O. Doebner & W. v. Miller, Ber. 16 (1883) p. 2468.

Compound 28: according to H. Rupe et al., Helv. Chim. Acta 18 (1935) p. 1395–1413.

Compound 29: preparation described by F. Duvel, Ann. 410 (1915) p. 54–70.

Compound 30: prepared according to Brit. Pat. 742,138.

Compounds 31 and 32 were prepared according to a general method, described in Houben-Weyl, Methoden der organischen Chemie, Stickstoffverbindungen I, Teil 3 (1965) p. 34–5.

Compound 33: according to J. Stuchlik et al., Chem. Listy 50 (1956) p. 662.

Compound 34: is prepared as described by O. Hinsberg, Ann. 292 (1896) p. 245.

It is surprising that the organic onium compounds of the above Table, which do not contain a long chain ($<C_{12}$) organic group, yield the desired hydrophobic-hydrophilic differentiation pattern for planographic printing. At present an explanation for the phenomenon cannot be given.

The exposure of the silver halide emulsion material can be carried out according to any usual technique e.g. by contact, by back reflection, by transmission (optical projection) or episcopically.

A light-sensitive element that is transparent can be exposed from either the front or the back. An element with an opaque backing support has to be exposed from the front.

The transparent photographic materials allow the exposure in a camera through the base without using a reversing prism. By such back exposure a lateral image reversal is obtained and as a result thereof, a correctly oriented copy is obtained when the light-sensitive element is processed as described herein and used as planographic offset printing plate.

In a preferred embodiment of the present invention the development and treatment with the lithographic liquid of the photo-exposed silver halide material is carried out in a processing apparatus, in which the material is transported automatically through processing stations in which the development and the transformation of the image-wise exposed photographic material into a planographic printing form take place.

For example, each station comprises a tray for holding an appropriate processing liquid, through which the photographic material is transported. After the development stage surplus developing liquid adhering to the material is removed e.g. by passing the developed material between squeegee rollers. The processing preferably proceeds at room temperature (about 18° to about 25° C) but may proceed at higher temperatures. Care must be taken, however, that the emulsion layer is not damaged.

The developing station and hydrophobizing station can be arranged separately but preferably they are grouped in a compact unit, in which the photographic material is carried automatically at a constant speed from the developing tray into one or more other tray(s).

The treatment with the lithographic liquid normally lasts but 30 seconds at 20°–30° C.

A useful processing apparatus is e.g. a common tray processing station as used in the known four-bath silver halide-thiocyanate stabilization processing (see e.g. the U.K. Pat. No. 1,243,180 filed Oct. 11, 1967 by Gevaert-Agfa N.V.) more particularly the RAPIDOPRINT UNIT DD 1437 (Rapidoprint is a trade-name of Agfa-Gevaert Naamloze Vennootschap, Mortsel, Belgium). The first tray of said unit is filled with activator solution, the three following trays contain the aqueous lithographic liquid.

The lithographic plates obtained according to the present invention need not to be inked immediately. They may be stored for weeks before printing.

In the printing operation a direct litho or offset ink is applied to the treated plate and before or after the application of the ink the plate is brought in contact with a water fountain solution that is commonly used in lithographic printing. According to a special embodiment the water fountain solution is mixed with the ink thus forming an emulsion.

Conventional direct litho and offset inks are described in the book: "Printing Ink Technology" by E.A. Apps, Leonard Hill [Books] Limited Eden Street, London, N.W. 1 (1961) p. 347–353.

The conventional direct litho and offset inks are of the stand oil type and alkyd type. Alkyds are very popular resins for offset inks. They can be separated into unmodified glyceryl phthalate alkyds, drying oil modified alkyds, non-drying oil modified alkyds, natural resin modified alkyds and synthetic resin modified alkyds. Sometimes alkyds have been classified according to their use for air drying purposes, stoving finishes, or compatibility with drying oils or nitrocellulose.

Short oil alkyds contain 25–45 per cent oil, medium oil alkyds 45–56 per cent, and long oil alkyds 65–85 per cent oil. As the oil length shortens: the viscosity rises, the molecular complexity and cross-linking tendency increase, the acid value becomes rather high since the process must be stopped early to avoid gelation, while the air-drying properties decline then cease; short oil alkyds have to be stoved. Unmodified alkyds have such poor solubility that they are seldom used for paints or inks.

Drying oil-modified alkyds comprise the most important group. They can be thinned to a working consistency with drying oils and cheap organic solvents and have film-forming properties, since they absorb oxygen from the air and dry by air curing. The drying process is catalysed by cobalt, lead, and manganese driers. Long oil alkyds are soluble in high boiling petroleum and aliphatic solvents, but as the oil length decreases more turpentine or white spirit must first be used followed by aromatic solvents. Aromatic white spirit, xylene, or naphtha have to be used for the shorter oil length alkyds.

The properties of lithographic paper are discussed in the same book of E. A. Apps on pages 455–456.

The "water fountain solution" is used to damp the plate. (Compositions of such solution are described e.g. in Ilford Graphic Arts Manual Vol. 2 "Photolithography" by H. M. Cartwright (1966) p. 437.

The general principles of the operation of offset press machines are illustrated in said book on pages 435 and 436 and in the book of E. A. Apps, on page 339.

The following examples illustrate the present invention without however, limiting it thereto.

EXAMPLE 1

Composition of the photographic material.

A subbed polyethylene terephthalate base was coated with a lith-emulsion. The silver halide grains of the lith emulsion contained 25 mole % of bromide and 75 mole % of chloride. The emulsion was sensitized spectrally to green light. The average grain size of the silver halide was 0.35 micron. The silver halide coverage expressed in silver nitrate was 10 g per sq.m. The ratio by weight of gelatin to silver halide expressed as silver nitrate was 5.8:10.

On top of the silver halide emulsion layer an anti-abrasion layer essentially consisting of gelatin and containing silica particles of an average grain size of 5 microns was provided. The silica coverage was 0.01 g per sq.m. The gelatin coverage of the anti-abrasion layer was 0.6 g per sq.m. In the preparation of the coating composition of the anti-abrasion layer formaldehyde was added in a weight ratio of 6:100 with respect to the gelatin.

The Exposure

The photographic material was exposed optically to a halftone original in a process camera (see for such camera "The Lithographers Manual" 4th Ed. by Charles Chapiro, The Graphic Arts Technical Foundation, Inc. 4615 Forbes Avenue, Pittsburgh Pa., pages 5–34 and 5–35). The halftone original was obtained on a silver halide paper by contact printing of a 120 lines per inch screen in superposition with a continuous tone original transparency. The halftone original contained areas filled with screen dots in a range from 3 % of black to 97 % of black.

The Processing

The photo-exposed photographic material was developed for 1 minute in a tray at 25° C in a developer having the following composition:

| | |
|---|---|
| anhydrous sodium sulphite | 30 g |
| p-formaldehyde | 7.5 g |
| potassium metabisulphite | 2.5 g |
| potassium bromide | 1.5 g |
| hydroquinone | 23 g |
| boric acid | 7.5 g |
| water up to | 1000 ml |

The surplus developer was removed by leading the exposed material between two squeegee rollers. Subsequently, the material was treated in a tray for 30 sec at a temperature of 25° C with an aqueous lithographic solution having the following composition:

| | |
|---|---|
| KI | 10 g |
| $Na_2S_2O_3 \cdot 5H_2O$ | 40 g |
| onium compound 1 of the Table | 20 g |
| water up to | 1 liter. |

The thus treated material was dried under atmospheric conditions. It was ready then for use as a planographic printing plate with positive image values based on the halftone original. It was mounted on an offset printing apparatus A. B. Dick 350 CD (trade name), in which the plate was wet with water or an other fountain solution (e.g. liquid composed of 90 ml of water, 10 ml of glycerol, 2 ml of colloidal silica, and 2 ml of phosphoric acid). The fatty printing ink was composed as follows:

| | parts by weight |
|---|---|
| Lake Red C (C.I. 15,585) | 80 |
| styrenated linseed-tung oil alkyd of 60 per cent oil length and 10 per cent styrene content | 100 |
| aliphatic petroleum having a boiling range of 260–290° C | 50 |
| lead metal (as naphthenate) | 1 |
| cobalt metal (as naphthenate) | 0.12 |

Said fatty ink is a conventional offset ink described in the book "Printing Ink Technology" by E. A. Apps, Leonard Hill [Books] Limited, Edenstreet, London, N.W. 1 (1961) on page 348. The styrenated linseed-tung oil alkyd resin used in said ink is commercially available under the trade name SCOPOL 41 of Styrene Co-Polymers Ltd. England.

Lake Red C is an organic azopigment having the following structural formula:

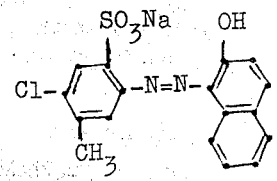

This fatty printing ink was applied and the printing started. More than 10,000 copies having good quality could be produced with a reproduction of 5% to 95% dot value starting from said screened original (120 lines per inch). The maximum density of the ink deposit was more than 1.0.

Analogous printing results were obtained when the other cationic compounds of the Table were used instead of compound 1.

The amount of compounds 1 to 34 of the Table preferably was not lower than $10^{-2}$ moles per liter.

EXAMPLE 2

Example 1 was repeated but after having been developed the silver halide material was treated for 30 seconds at room temperature (20° C) with an acid stopbath being a 1% by weight aqueous solution of acetic acid.

Thereupon the silver halide material was treated for 30 seconds at room temperature with the following solution offering planographic printing properties to the material:

| | |
|---|---|
| potassium iodide | 10 g |
| onium compound 1 of the Table | 20 g |
| water up to | 1000 ml |
| pH : 5 | |

EXAMPLE 3

Example 1 was repeated, but the following treating solution was used:

| | |
|---|---|
| water | 250 ml |
| citric acid | 50 g |
| sodium hydroxide (about 9.5 g) up to pH 3 | |
| onium compound 1 of the Table | 20 g |
| potassium iodide | 10 g |
| water up to | 1000 ml |
| pH : 3 | |

EXAMPLE 4

Example 1 was repeated with the difference, however, that the lithographic liquid had the following composition:

| | |
|---|---|
| monosodiumphosphate-dihydrate | 1 mole |
| onium compound of table | $6.5 \times 10^{-2}$ moles |
| potassium iodide | $1.3 \times 10^{-1}$ moles |
| water up to | 1 liter |
| The pH of this solution was 4.4. | |

When the onium salt was an iodide, half the amount of potassium iodide was used.

EXAMPLE 5

Example 4 was repeated with the difference however, that the lith-emulsion was coated at a silver halide coverage equivalent to only 2 grams of silver nitrate per square meter.

EXAMPLE 6

Example 5 was repeated, but the lith-emulsion was coated on a subbed polyethylene terephthalate support, that had been precoated with the following solution at a coverage of 4 g/sq.m.:

| | |
|---|---|
| gelatin | 78 g |
| saponine 12.5 % in ethanol/water vol. ratio 2:8 | 30 ml |
| Hostapon T (trade name) 5 % in water | 20 ml |
| formaldehyde (20 % ) in water | 14 ml |
| water to make | 1 liter. |

(HOSTAPON T is a trade name of Farbwerke Hoechst A. G., Frankfurt/M. Höchst - Federal Republic of Germany for the wetting agent oleylmethyltauride).

EXAMPLE 7

Example 6 was repeated with the difference, that a sufficient amount of carbon black (size: about 5 microns) to obtain a coverage of 0.1 g/sq.m. was added to the coated gelatin layer. In this way an anti-reflection layer was obtained that was sufficiently transparent to permit the exposure through the rear side of the material.

EXAMPLE 8

Examples 1–7 were repeated, with subbed polyethylene coated paper as support (manufactured and sold by Wiggins Teape (Mill Sales Ltd.) under the name of Chloritene Litho Base 90 g/sq.m.).

EXAMPLE 9

A photographic material with incorporated developing agents was prepared by adding to the composition of the anti-reflection layer of Example 7 hydroquinone and 1-phenyl-4-methyl-pyrazolidin-3-one to obtain a coverage of 0.66 and 0.09 grams per square meter respectively.

The image-wise exposed material was developed by treating it for 8 seconds at 24° C with the following activator solution:

| | |
|---|---|
| sodium hydroxide | 30 g |
| sodium sulfite | 50 g |
| potassium bromide | 2 g |
| water to make | 1 liter. |

The surplus activator was removed by squeezing the material between resilient rollers. Subsequently, the material was treated with the lithographic liquid as described in Examples 1–4.

EXAMPLE 10

Example 9 was repeated with the difference, however, that the developing substances were added to the anti-abrasion layer in the same ratio.

EXAMPLE 11

Example 10 was repeated, but the anti-reflection layer was coated on the rear side of the support.

EXAMPLE 12

Example 9 was repeated, but the anti-abrasion layer was omitted. An anti-abrasion agent (viz. the silica particles described in Example 1) was added to the emulsion layer at a coverage of 0.3 g/sq.m.

EXAMPLE 13

Example 10 was repeated, but the anti-abrasion layer was replaced by the following composition, coated at a ratio of 17 grams per square meter:

| | |
|---|---|
| gelatin | 1 g |
| saponine 112.5 % in ethanol/water 2:8 | 25 ml |
| Tergitol 4 (trade name) 5 % in water | 5 ml |
| hydroquinone | 38 g |
| 1-phenyl-4-methyl-pyrazolidin-3-one | 5 g |
| formaldehyde (20 %) in water | 25 ml |
| water to make | 1 liter. |

An anti-abrasion layer was coated on the rear side of the polyethylene terephthalate support at a ratio of 60 g/sq.m.:

| | |
|---|---|
| gelatin | 75 g |
| silica (particle size 0.5 to 1 micron) | 50 g |
| EDTA-tetrasodium salt | 20 ml |
| Akypo OP-80 (trade name) 5 % aqueous solution | 4 ml |
| glyoxal (3.5 % aqueous solution) | 34 ml |
| dimethylolurea 4.8 % aq.sol. | 34 ml |
| water | 760 ml. |

(TERGITOL 4 is a trade name of Union Carbide and Carbon New York U.S.A. for the wetting agent sodium isotetradecyl sulphate). (AKYPO OP-80 is a trade name of Chemy, The Netherlands for a wetting agent having the following structural formula:

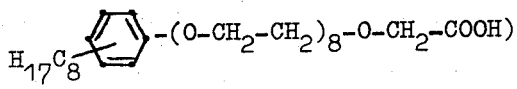

EXAMPLE 14

A mono-disperse, cubic, direct-positive photographic emulsion containing approximately 80 mole % of silver chloride, 18 mole % of silver bromide and 2 mole % of silver iodide, and having an average grain size of 0.25 micron, was prepared under controlled pH, pAg and temperature conditions during the precipitation of the mixed silver halide. The pH was maintained at 5, the pAg at 6.83 and the temperature at 60° C. The emulsion was chilled, shredded and washed with cold water. At 40° C, gelatin and water were added in order to obtain a gelatin to silver nitrate ratio of 0.6 and a concentration of silver halide corresponding to 160 g of silver nitrate pro kg of emulsion. The emulsion was digested at 57° C, pH 7 and pAg 6.16 for about 2 h in the presence of potassium chloroaurate (1.5 mg/mole of silver nitrate).

After addition of 500 mg of pinacryptol yellow and 340 mg of the following spectral sensitizer:

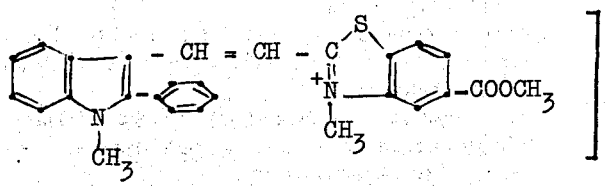 

per mole of silver halide, the pH and the pAg of the emulsion were adjusted with sulfuric acid and potassium bromide resp. to pH 5 and pAg 9.60. The emulsion was coated on a polyethylene terephthalate support at a silver halide ratio corresponding with 6 g of AgNO₃ per sq.m. On top of the layer, the anti-abrasion layer described in Example 1 was coated, whereas on the rear side, the anti-reflection layer of Example 11 was coated. The material was exposed image-wise and processed as described in Example 4. A negative-working offset-plate was obtained. Screen dots in the range of 5–95 % dot value at 48 lines per centimeter were reproduced perfectly.

EXAMPLE 15

Examples 9–13 were repeated, but the processing took place in the apparatus: RAPIDOPRINT (trade name) type DD 1437. The activator solution was placed in the first tray, the aqueous lithographic liquid in the three following trays. In this way, an offset-plate was obtained in but 30 seconds, the exposure and drying not being included.

The drying time of the plate can be kept very short by combining the RAPIDOPRINT apparatus DD 1437 with the RAPIDOPRINT DR 37 drying apparatus.

EXAMPLE 16

A negative-working lith material as described in Example 1 was processed in such a way that finally, a negative-working offset plate was obtained. The exposed film was developed and fixed in a common sodium thiosulfate fixing solution. After thorough washing with water (5–10 minutes), the material was bleached by immersing it in the following solution for 2 minutes at 24° C:

| | |
|---|---|
| potassium iron(III)cyanide | 60 g |
| potassium bromide | 60 g |
| water to make | 1 liter. |

The material was washed with water for 5 minutes and then treated with a lithographic solution as described in Examples 1–4. The plate obtained had planographic printing properties of the same quality as obtained by the processing of the preceding Examples.

EXAMPLE 17

The treatment of the photographic materials described in the Examples 1–8, 14, and 17 with the lithographic liquid used in said Examples was carried out in the Rapidoprint DD 1437 apparatus, the lithographic liquid being placed in all 4 trays.

EXAMPLE 18

The Examples 9–17 were repeated, but the photographic material had the polyethylene-coated paper described in Example 8 as support.

We claim:
1. A method for the preparation of a planographic printing plate containing the step of:
   image-wise photo-exposing a photographic material containing a silver halide emulsion layer, in which the silver halide is present in a water-permeable colloid binder to form in said material exposed image regions and unexposed background regions, developing the information-wise photo-exposed photographic silver halide material to leave a poorly water-soluble silver salt in one of said image and background regions, and treating said developed material containing said poorly water-soluble silver salt in said region with an aqueous liquid to render the regions thereof containing said silver salt receptive to lithographic printing ink, said treating liquid containing dissolved therein at least one organic cationic onium compound, iodide ions, and a sufficient amount of hydronium ions ($H_3O^+$) for creating an acidic medium, said liquid being capable upon overall contact for 30 sec at 22° C of making an unexposed and undeveloped photographic silver halide test material sufficiently receptive to a test lithographic ink to form when used for lithographic printing with said lithographic ink, a printed ink deposit on lithographic printing paper having a spectral density of at least 0.5 measured at the absorption maximum of said ink, said photographic test material comprising a flexible polymeric film or paper support carrying a silver halide emulsion layer with the following characteristics:

1. said silver halide is silver chlorobromide (75:25 mole % chloride to bromide),
2. the average grain size of the silver halide is 0.35 micron,
3. the silver halide coverage, expressed as silver nitrate, is 10 g per sq.m.,
4. the ratio by weight of gelatin to silver halide, expressed as silver nitrate, is 5.8:10,
5. the thickness of the emulsion layer is 8 microns, and
6. the emulsion layer is coated with an anti-abrasion layer having a thickness of 0.6 micron applied from a coating composition containing gelatin, silica particles and formaldehyde, the formaldehyde being present in a weight ratio of 6:100 with respect to the gelatin, the silica particles having an average grain size of 5 microns, the coverage of silica particles being 0.01 g per sq.m, and the gelatin coverage being 0.6 g per sq.m; and said test lithographic ink has the following composition:

| | parts by weight |
|---|---|
| Lake Red C (C.I. 15,585) | 80 |
| Styrenated linseed-tung oil alkyd of 60 per cent oil length and 10 per cent styrene content | 100 |
| aliphatic petroleum having a boiling range of 260–290° C | 50 |
| lead metal (as naphthenate) | 1 |
| cobalt metal (as naphthenate) | 0.12 |

2. A method according to claim 1 wherein prior to the treatment of said silver halide photographic material with said aqueous lithographic liquid, the exposed and developed silver halide emulsion layer is treated with a photographic fixing liquid to dissolve and remove the silver halide remaining after development, the silver image produced by such development is oxidized and rehalogenated to poorly water-soluble silver salt form and the thus processed material is then treated with said aqueous liquid.

3. A method according to claim 1, wherein the organic cationic compound(s) correspond(s) to one of the following general formulae :

(1)

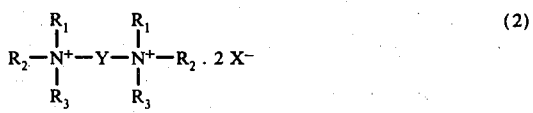
(2)

(3)

(4)

(5)

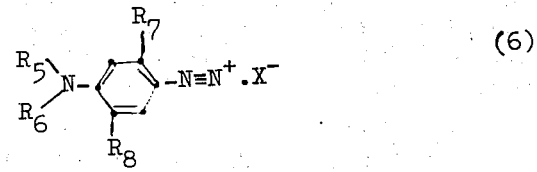
(6)

wherein :
each of $R_1$, $R_2$, $R_3$, and $R_4$ (same or different) represents an aliphatic group or a cycloaliphatic group, having not more than 5 carbon atoms in straight line, or $R_1$ and $R_2$ together represent the necessary methylene groups or methylene groups interrupted by oxygen or

to close a 5- or 6-membered nitrogen-containing heterocyclic nucleus,

Y represents an organic bivalent group containing at most 10 carbon atoms in straight line, $Z_1$ represents the necessary atoms to close a 5- or 6-membered nitrogen-containing heterocyclic nucleus, R represents an aliphatic group or a cycloaliphatic group, said groups having not more than 8 carbon atoms in straight line, $Z_2$ represents the necessary atoms to close a pyrylium nucleus or a pyrylium nucleus condensed with an aromatic nucleus, $Z_3$ represents the necessary atoms to close a thiapyrylium nucleus or a thiapyrylium nucleus condensed with an aromatic nucleus, each of $R_5$ and $R_6$ (same or different) represents hydrogen or a $C_1$–$C_2$ alkyl group, each of $R_7$ and $R_8$ (same or different) represents hydrogen or a $C_1$–$C_4$ alkoxy group and $X^-\Sigma$ represents one or more anions in an amount equivalent to the onium groups in the onium compounds, but X⁻ is missing when the anion is contained already in the R substituent.

4. A method according to claim 3, wherein $Z_1$ represents the necessary atoms to close a benzothiazolium, indoleninium, benzimidazolium, tetrazolium, quinoxalinium, pyridinium, or quinolinium nucleus.

5. A method according to claim 1, with the modification that the aqueous lithographic liquid is free from said hydronium ions but between the developing and said treating step the silver halide material is treated with an acidic aqueous solution.

6. A method according to claim 5, wherein said acidic aqueous solution is an acidic photographic stop bath.

7. A method according to claim 1, wherein a positive working printing master is prepared by image-wise photoexposing a negative silver halide material, developing said material and treating it with said aqueous lithographic liquid.

8. A method according to claim 1, wherein a negative working printing master is prepared by image-wise photoexposing a direct-positive silver halide material, developing said material and treating it with said aqueous lithographic liquid.

9. A method according to claim 1, wherein the silver halide of the photographic test material contains at most a minor amount of silver iodide.

10. A method according to claim 9, wherein the silver halide material contains a silver halide emulsion, which when developed in a "lith-type" developer can yield images with a gamma value above 3.

11. A method according to claim 10, wherein the silver halide is silver chloride, silver chlorobromide, or silver chlorobromoiodide grains containing less than 5 mole % of iodide.

12. A method according to claim 1, wherein the photographic material comprises a silver halide emulsion layer coated with an anti-abrasion layer containing gelatin and a hardener for gelatin.

13. A method according to claim 1, wherein the development of the image-wise exposed photographic silver halide material is carried out with a lith developer composition.

14. A method according to claim 1, wherein the development is carried out with a p-dihydroxybenzene developing agent as primary developing agent in the presence of an auxiliary developing agent of the monomethyl-p-aminophenol type or 3-pyrazolidinone type.

15. A method according to claim 1, wherein said photographic material initially contains the total amount of developing agent used in its development and during the developing step the material is treated with an aqueous alkaline activating liquid.

16. A method according to claim 1, wherein the iodide content in the aqueous liquid is from about $10^{-2}$ mole to 1 mole per liter.

17. A method according to claim 1, wherein the aqueous treating liquid has a pH in the range from about 1.0 to about 6.5.

18. A method according to claim 1, wherein the content of organic onium compound is from about $10^{-2}$ mole to about $10^{-1}$ mole per liter.

* * * * *

UNITED STATES PATENT AND TRADEMARK OFFICE
CERTIFICATE OF CORRECTION

PATENT NO. : 3,989,522
DATED : November 2, 1976
INVENTOR(S) : Albert Lucien Poot et al It is certified that error appears in the above-identified patent and that said Letters Patent are hereby corrected as shown below:

Column 28, line 40, before "having" there should be inserted -- said groups --.

line 57, ", said groups" should be cancelled after "group".

line 68, "$X^-\Sigma$" should read -- $X^-$ --.

Column 29, line 4, "3" should read -- 1 --.

Column 30, line 11, "lith" should read -- "lith" --.

line 29, "1" should read -- 2 --.

The word "Oleophicic" at the end of the title should read -- Oleophilic --.

Signed and Sealed this

Fourth Day of January 1977

[SEAL]

Attest:

RUTH C. MASON
Attesting Officer

C. MARSHALL DANN
Commissioner of Patents and Trademarks

UNITED STATES PATENT OFFICE
CERTIFICATE OF CORRECTION

PATENT NO. : 3,989,522
DATED : November 2, 1976
INVENTOR(S) : Albert Lucien Poot et al It is certified that error appears in the above-identified patent and that said Letters Patent are hereby corrected as shown below:

In the Heading:

Item [75] Inventors, "Frans Clement" should read

-- Frans Clement Heugebaert --.

Signed and Sealed this

Eighth Day of March 1977

[SEAL]

Attest:

RUTH C. MASON
Attesting Officer

C. MARSHALL DANN
Commissioner of Patents and Trademarks